United States Patent [19]
Burns et al.

[11] Patent Number: 5,856,690
[45] Date of Patent: *Jan. 5, 1999

[54] DIELECTRIC FOR AMORPHOUS SILICON TRANSISTORS

[75] Inventors: Stanley G. Burns, Ames, Iowa; Carl Gruber, Le Sueur, Minn.; Howard R. Shanks, Ames, Iowa; Allan P. Constant, Ames, Iowa; Allen R. Landin, Boone, Iowa; David H. Schmidt, Ames, Iowa

[73] Assignee: Iowa State University Research Foundation, Ames, Iowa

[*] Notice: This patent issued on a continued prosecution application filed under 37 CFR 1.53(d), and is subject to the twenty year patent term provisions of 35 U.S.C. 154(a)(2).

[21] Appl. No.: 763,550

[22] Filed: Dec. 10, 1996

Related U.S. Application Data

[63] Continuation of Ser. No. 319,849, Oct. 7, 1994, abandoned.
[51] Int. Cl.⁶ .................................................. H01L 29/788
[52] U.S. Cl. .......................... 257/315; 257/316; 257/411
[58] Field of Search ..................... 257/316, 315, 257/365, 360, 411, 262, 261, 310; 437/1; 365/239; 438/197

[56] References Cited

U.S. PATENT DOCUMENTS

| | | | |
|---|---|---|---|
| 4,660,062 | 4/1987 | Nishizawa et al. | 257/345 |
| 5,237,188 | 8/1993 | Iwai et al. | 257/411 |
| 5,274,602 | 12/1993 | Glenn | 365/239 |
| 5,334,539 | 8/1994 | Shinar et al. | 437/1 |
| 5,389,811 | 2/1995 | Poucher et al. | 257/360 |
| 5,432,110 | 7/1995 | Inoue | 257/316 |
| 5,452,250 | 9/1995 | Riggio, Jr. | 257/316 |

OTHER PUBLICATIONS

IBM technical disclosure bulletin vol. 28, No. 6, pp. 2665–2666, Nov. 1985.

"The Origin Of Slow States At The Interface of α–Si:H And Silicon Nitride", by R. A. Street et al., Mat. Res. Soc. Symp. Proc. vol. 70, 1986, pp 367–372.

"Hydrogenated Amorphous Silicon Thin–Film Transistor–Based Circuit Development For Use In Large Memories", by Stanley G. Burns et al., AMLCD Symposium, Lehigh University, Bethlehem, PA (Oct. 1993).

"Properties Of The Interface Between Amorphous Silicon And Nitride", by Tsai etal., Mat. Res. Soc. Symp. Proc. vol. 70, pp. 351–359.

"Defect States In Silicon Nitride", by Robertson et al., Mat. Res. Soc. Symp. Proc. vol. 49, pp. 215–222.

*Primary Examiner*—Sara Crane
*Attorney, Agent, or Firm*—Leydig, Voit & Mayer, Ltd

[57] ABSTRACT

A thin film floating gate transistor with improved dielectric structure. The dielectric structure serves the purpose of encapsulating the floating gate and also interfacing with the semiconductor material, α-Si:H. It thus must meet a variety of requirements. In order to provide long memory retention times, the dielectric material, at least in the regions encapsulating the floating gate, must have a high resistivity, on the order of $10^{17}$ ohm-cm or better. Silicon dioxide is the preferred material for encapsulating the floating gate. However, since silicon dioxide creates a high density of defect state when interfaced with the α-Si:H layer. An interface layer, substantially free of oxide, is interposed between the high resistivity layer and the α-Si:H. Preferably, the interface portion of the dielectric layer is silicon nitride. In some cases, it is desirable to replace the entire dielectric structure, or at least the interface layer with aluminum nitride.

2 Claims, 6 Drawing Sheets

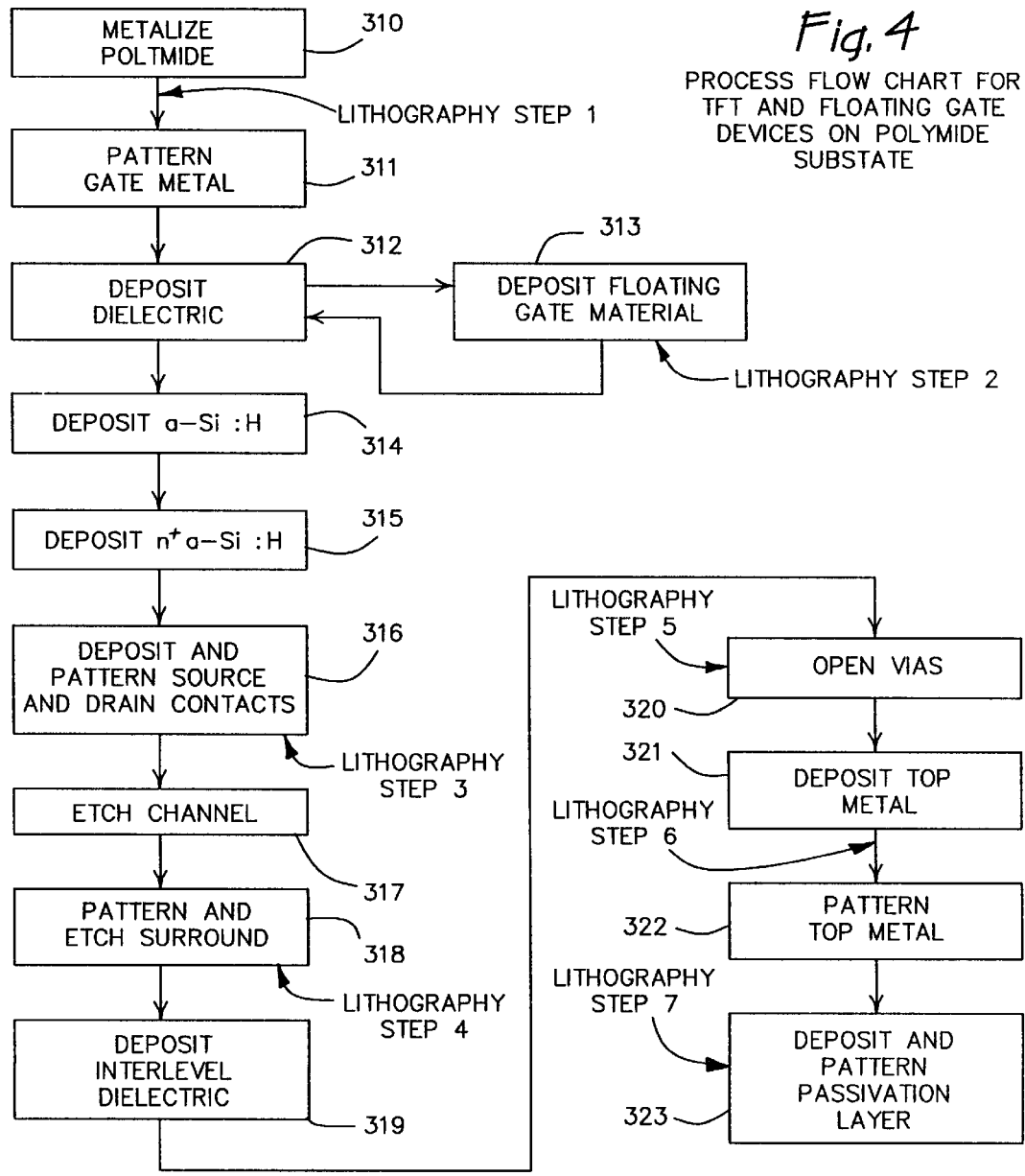

DIELECTRIC FOR AMORPHOUS SILICON TRANSISTORS

This is a continuation of application Ser. No. 08/319,849 filed on Oct. 7, 1994, now abandoned.

The United States Government has certain rights in this invention pursuant to Contract No. MDA 972-902-J-1009 between Advanced Research and Project Agency of the Department of Defense and Iowa State University.

FIELD OF THE INVENTION

This invention relates to thin film transistors, and more particularly to floating gate thin film transistors with an improved dielectric structure.

BACKGROUND OF THE INVENTION

Amorphous silicon has been used in semiconductor devices, but such devices have not enjoyed the popularity of more conventional monocrystalline semiconductor devices. Amorphous silicon semiconductors have the advantage of being fabricatable on flexible substrates, and thus present the possibility of formation on a number of different kinds of substrates, unlike the crystalline semiconductor substrate conventionally used. The non-crystalline properties of amorphous silicon semiconductors also present the opportunity for forming very large scale devices, since such devices are not limited by the crystal and die size limitations normally associated with crystalline semiconductors.

Amorphous silicon devices, however, possess a number of significant drawbacks. First of all, leakage through the amorphous semiconductor material is typically quite high, making it difficult to isolate one device from another. Switching speed and frequency response is not suitable for many applications. Amorphous silicon semiconductor devices have been utilized extensively in large scale solar cells, for example, where the tradeoff allowing large size and flexibility outweighs the disadvantages. Amorphous silicon devices have also been used in very large scale memories which were impractical of construction with conventional crystalline semiconductors. However, in the majority of situations, where requirements of switching speed and device size akin to current semiconductor technology are required, amorphous silicon devices have typically not been applied.

Even MOS devices, although not as fast as bipolar semiconductors, have been improved to realize relatively fast switching speeds. However, the physical structure of a MOS device has a very, very thin layer of oxide interposed between metallic electrodes and the doped surface of the silicon semiconductor material. The very small capacitance introduced by the very thin insulating layer (typically silicon dioxide) allows the voltage impressed on the electrodes to set up fields (depletion regions) in the semiconductor material just below the surface. However, equivalent devices are not possible in amorphous silicon for a variety of reasons. The end result is that typically, comparatively thicker layers of dielectric material are required to be interposed between the gate metallization and the amorphous silicon layer, whereas there is no requirement for insulation between the source and drain electrodes and the corresponding doped areas of the amorphous silicon transistor. This fundamental structural difference is in part responsible for the relative slowness in switching of amorphous silicon devices. However, that relative slowness has been tolerated because of the applications in which the devices have typically been employed.

SUMMARY OF THE INVENTION

In view of the foregoing, it is a general aim of the present invention to provide a substantially improved thin film transistor structure, including floating gate thin film transistors capable of operating as memory devices, and capable of satisfying many of the requirements normally associated with more conventional semiconductor technology.

In accomplishing that aim, it is an object of the present invention to provide thin film transistor structures of reduced feature size and high packing density capability. For example, the present invention provides transistor structures in which the gate width is less than 10 microns, typically on the order of 2 or 5 microns.

It is an important object of the present invention to provide a thin film transistor structure in which the dielectric layer provides for the production of floating gate thin film transistor structures with useful memory retention times. Thus, an object of the present invention is to provide a structure whereby a floating gate in a thin film transistor is adequately insulated from its surrounding elements, but where the switching speed for the device is compatible with modern switching requirements.

Other objects and advantages will become apparent from the following detailed description when taken in conjunction with the drawings, in which:

BRIEF DESCRIPTION OF THE DRAWINGS

FIG. 4 is a diagram of process flow for constructing a thin film transistor according to the present invention.

DETAILED DESCRIPTION OF THE PREFERRED EMBODIMENTS

While the invention will be described in connection with certain preferred embodiments, there is no intent to limit it to those embodiments. On the contrary, the intent is to cover all alternatives, modifications and equivalents included within the spirit and scope of the invention as defined by the appended claims.

Figure 1:
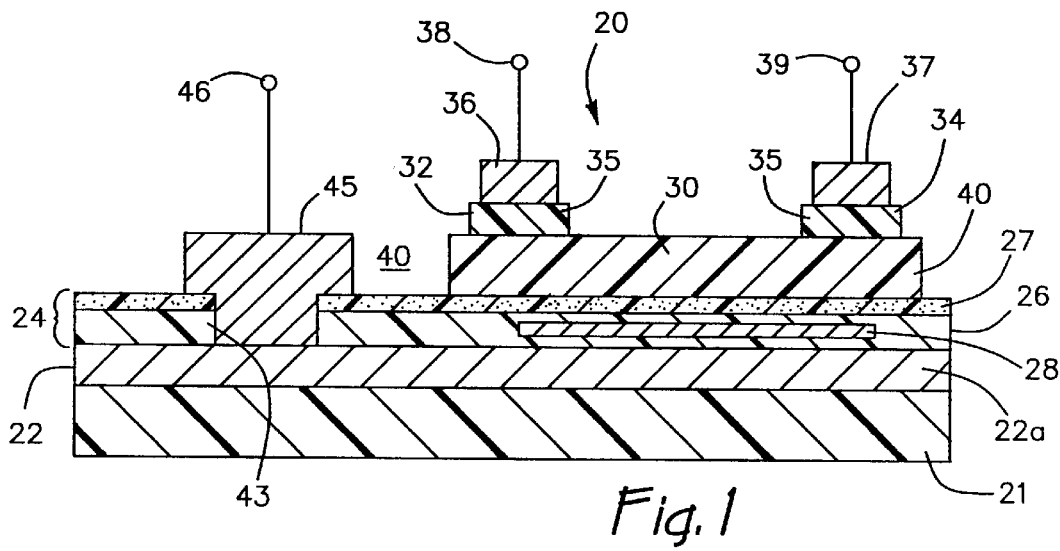
FIG. 1 is a cross-sectional representation of a floating gate thin film transistor constructed in accordance with the present invention.

Turning now to the drawings, FIG. 1 is illustrative of the present invention in that it shows a thin film transistor of small feature size and capable of high density packing in an integrated circuit. It will be appreciated by those skilled in the art that the layers shown as making up the thin film transistor are not drawn to scale, but are drawn to facilitate an understanding of the composite structure of the device.

The transistor 20 illustrated in FIG. 1 is a floating gate transistor formed on an insulating substrate 21, preferably a thin, flexible, polyimide film. A metallization layer 22 is formed on the substrate and patterned to form a control gate 22a for the transistor device and also to form interconnections to other circuitry in the device. Deposited on the metallization layer 22, which is preferably of chromium, is a dielectric layer 24. The characteristics of the dielectric layer 24 are particularly important in the formation of the floating gate transistor.

More particularly, because the floating gate, when it is programmed, functions by trapping charge, and because that trapped charge must be stored for long periods of time, on the order of months or more, the dielectric layer in which the floating gate is embedded must be of very high resistivity. Conventional dielectrics such as silicon nitride have an inadequate resistivity, and the memory retention times using such dielectric layer will be inadequate. However, there are dielectrics, such as silicon dioxide, which have very high resistivities, on the order of $10^{17}$ to $10^{18}$ ohm-cm, and the charge retention time in devices using resistivities at that level are measured in months or more. Aluminum nitride, when properly deposited and oriented, can also be formed with very high resistivity, making it suitable as a dielectric for encapsulating the floating gate.

There are other requirements imposed on the dielectric layer, however. Since the dielectric layer is in contact with the amorphous silicon which forms the active semiconductor element of the device, the ability to interface with the amorphous silicon is important. It is found that utilizing silicon dioxide in contact with the amorphous silicon layer, a high density of interfacial defects is created, forming traps for the carriers, thereby detrimentally affecting mobility through the channel. It is believed that the oxide component of the silicon dioxide is the factor which creates the high density of interfacial defects. While some oxide is tolerable, such as in silicon oxynitride with a low oxygen content, it is preferable to keep the region of the dielectric which is in contact with the amorphous silicon layer as oxide-free as practical.

The detailed nature of the dielectric layer capable of meeting these requirements will be discussed in greater detail below. Thus, referring again to FIG. 1, the dielectric layer 24 is a composite layer comprising a first high resistivity component 26 covered by a second component 27 adapted to provide an appropriate interface with the amorphous silicon semiconductor material. Embedded within the dielectric layer is a floating gate 28. In the preferred practice of the invention, the lower component 26 of the dielectric layer 24, that is, the component which encapsulates the floating gate 28, is of high resistivity dielectric material, on the order of $10^{17}$ ohm-cm or higher. Silicon dioxide is preferred for this application, since it has a resistivity of between $10^{17}$ and $10^{18}$ ohm-cm. The upper component 27 of the dielectric layer is a layer which is appropriate for interface with an amorphous silicon semiconductor material. In the FIG. 1 embodiment, the upper component 27 of the composite dielectric layer 24 is of silicon nitride. It is clearly preferred to avoid silicon dioxide in the interface layer, since the oxide creates interfacial defects with the amorphous silicon, and such defects tend to trap carriers and thereby degrade the characteristics of the transistor. Silicon nitride is found to interface with a minimum of created interfacial defects, and thus is preferred as the interface between the high resistivity dielectric and the amorphous silicon. The use of silicon nitride for the entire layer, however, is to be avoided since the resistivity thereof is inadequate to store the charge in the floating gate for a sufficiently long time.

Deposited on the dielectric layer 24 is an α-Si:H layer 30 which serves as the active semiconductor material for the thin film transistor. The amorphous silicon layer 30 has formed thereon doped regions 32, 34 which serve as the source and drain for the thin film transistor. The region 35 between the source and drain regions 32, 34 is the transistor channel. In accordance with the invention, the channel 35, which is typically the minimum dimension component of a thin film transistors, is on the order of 5 microns. It is presently preferred to utilize a minimum dimension of 2 microns, although with superior lithographic and associated equipment, the minimum dimension can be reduced still further, perhaps by an order of magnitude.

Metallic contacts 36, 37 are deposited over the source and drain regions 32, 34. The contacts 36, 37 are shown as being available for interconnects at 38, 39 for connection to outside circuitry, or to other devices in the structure.

In accordance with an important feature of a high density circuit, a trench area 40 is provided around the thin film transistor layer, and penetrates through the amorphous silicon layer 30. The trench 40 at the left-hand side of the transistor of FIG. 1 is shown penetrating to the upper surface of dielectric layer 27, which is the preferred construction. The area over the exposed dielectric is normally filled with an insulating material, such as silicon dioxide, although that layer is not used in FIGS. 1 and 2. A via 43 is etched to reach the chromium contact layer 22, and a metal contact 45 formed in the via 43 to serve as a gate electrode schematically illustrated at 46.

It will be appreciated that FIG. 1 shows only the features of one transistor device. Considering that the dimension 35 between the source and drain regions is on the order of 2 microns, it will be appreciated that the device as a whole occupies only a very limited portion, on the order of 100–200 square microns, of the substrate surface. It will therefore be appreciated that a large number of similar devices can be formed in a rather small area, and connected at an upper metallization layer to form more complex building blocks, and the building blocks interconnected to form more complex circuitry. Indeed, with the adaptability provided by amorphous silicon formed on large insulating substrates, this technology readily progresses beyond very large-scale integration into the next stage, which can be considered ultra-large scale integration.

Figure 2:
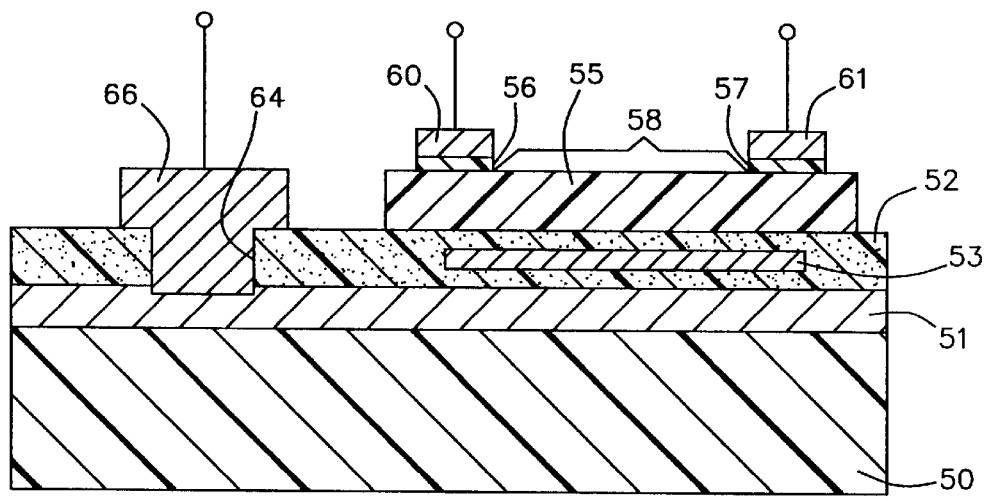
FIG. 2 is a view, similar to FIG. 1, representing an alternative configuration of the invention.

Turning then to FIG. 2, there is shown an alternate form of a floating gate thin film transistor constructed according to the practice of the present invention. FIG. 2 illustrates a floating gate transistor, not unlike the floating gate transistor of FIG. 1, but utilizing a different dielectric structure. Thus, the floating gate transistor of FIG. 2 is also formed on a thin insulating substrate 50 having a metal contact layer 51 formed thereon, the metal contact layer 51 being patterned to form a control gate structure for the floating gate transistor. A dielectric layer 52 is formed over the control gate layer 51. In contrast to the composite dielectric layer 24 of FIG. 1, the dielectric layer 52 of the FIG. 2 embodiment comprises only a single component of suitable dielectric material. The composite dielectric layer of FIG. 1 as noted above had two components, one high resistivity component to reduce leakage from the floating gate, and a substantially oxide-free component which provided an appropriate interface characteristic for the amorphous silicon. In the FIG. 2 embodiment, both of those requirements are satisfied by a single dielectric material for the layer 52. That dielectric layer is preferably an aluminum nitride layer which is formed to have adequate resistivity (on the order of $10^{17}$ ohm-cm), to prevent leakage from the floating gate, and also being sufficiently free of oxide to form an appropriate interface with the amorphous silicon semiconductor layer. As in the prior embodiment, a floating gate 53 is formed in the dielectric layer 52. Amorphous silicon layer 55 is deposited over the dielectric layer 52. Doped source and drain regions 56, 57 are formed on the amorphous silicon layer 55. The doped amorphous silicon layers define a channel 58 between the source and drain regions 56, 57. Metal contacts 60, 61 formed over the source and drain regions 56, 57 provide for interconnection to the remainder of the circuitry. FIG. 2 shows a via 64 etched directly in the aluminum nitride, and penetrating to the contact layer 51. A metal contact 66 formed in the via 64 serves as the gate connection for the device.

It will also be appreciated that a thin film transistor structure to serve as a switching transistor (as opposed to the memory device of the floating gate transistor) is readily formed as in the FIG. 1 and FIG. 2 embodiments, simply by eliminating the process steps which form the floating gate 28 or 53. The remaining transistor structure for normal thin film transistor will then be identical to that shown in FIG. 1 or FIG. 2, with the elimination of the floating gate.

The floating gate thin film transistor has the ability to function as a memory device. When the control gate of the floating gate transistor is brought to a programming potential, the state of charge at the floating gate will be controlled by the state of conduction of the source-drain region, which in turn will be a function of whether a data 1 or data 0 is to be stored. When the programming voltage is removed, the charge is stored on the floating gate, and can be read out (as a 1 or a 0) when appropriate addressing signals are provided. Programming is accomplished, not only by applying programming voltages to the control gate, but also by applying "programming" voltages (either positive or negative) to the bit lines, causing the device to conduct in saturation, and causing either the storage of electrons at the floating gate, or the removal of previously stored electrons from the floating gate, and thereby altering the threshold characteristics of the floating gate transistor. The floating gate is embedded in a high resistivity material, such that the charge collected at the floating gate is stored for a long period of time, on the order of months or more, and thus the threshold characteristic of the floating gate transistor is a function of the charge stored on the floating gate during the programming operation. When it is desired to read the information out of the device, the address lines are activated, and conduction through the floating gate transistor will either be above or below the predetermined threshold, depending on whether or not a programming charge is stored on the floating gate. Discrimination above or below the threshold allows the determination of a 1 or a 0 for the information stored in the bit of the memory represented by the floating gate transistor.

Figure 3:
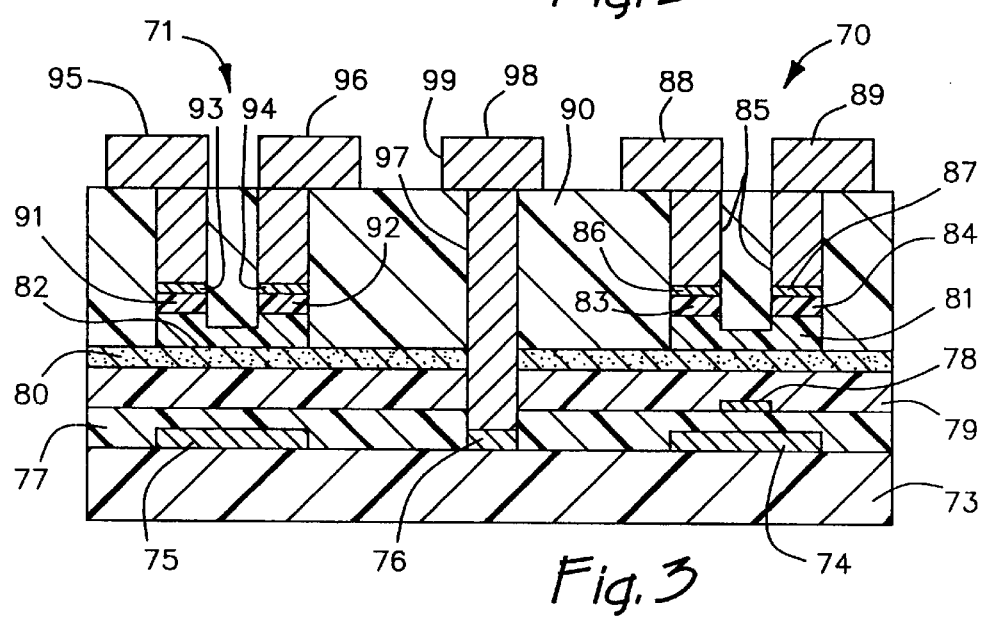
FIG. 3 is a diagram illustrating a substrate carrying a thin film transistor and a floating gate thin film transistor and exemplifying the present invention.

Before turning to the multiple transistor structure illustrated in FIG. 3, a summarization will be provided on the nature of the dielectric layer in accordance with the present invention. As noted above, the dielectric layer has a set of competing requirements including a very high resistivity in the area encapsulating the floating gate, and a chemical structure at the interface with the amorphous silicon layer which creates only a low density of interfacial defects so as to prevent trapping of charge at the interface. In the preferred implementation of the invention, the dielectric layer is preferably a two-component layer including high resistivity silicon dioxide in a lower region encapsulating the floating gate, and a lower resistivity material which has a better interface characteristic with amorphous silicon, preferably silicon nitride interposed between the silicon dioxide and the amorphous silicon.

In an alternative embodiment of the invention, that shown in FIG. 2, a single dielectric material is utilized, preferably aluminum nitride. The high dielectric constant which can be achieved with aluminum nitride is beneficial in improving the switching speed of the transistors. When forming the aluminum nitride dielectric, care must be taken in the deposition to achieve a relatively pure layer with generally random orientation to provide a resistivity of at least $10^{17}$ ohm-cm in the region encapsulating the floating gate. A greater degree of orientation is imparted to the upper region of the aluminum nitride layer to interface properly with the active amorphous silicon layer. The interface of aluminum nitride with amorphous silicon is substantially oxide-free, and therefore should create a very low level of interfacial defects.

In some cases, the deposition of the aluminum nitride will be such that the minimum $10^{17}$ ohm-cm resistivity requirement will not be met. In that case, it is also desirable to use a two-level dielectric as shown in FIG. 1 in which the lower level encapsulating the floating gate is a silicon dioxide insulator of very high resistivity, and interposed between the silicon dioxide and the amorphous silicon is an aluminum nitride dielectric layer. The aluminum nitride has even a higher dielectric constant than that of silicon nitride, which enhances the electrical characteristics of the transistor.

Turning then to FIG. 3, that drawing is intended to illustrate the physical configuration of a more complex thin film transistor circuit, in that it shows both a floating gate transistor 70 having the characteristics described in connection with FIG. 1, and a thin film transistor 71 configured as a switching (rather than storage) device. The thin film transistor devices 70, 71 are representative of numerous such devices, which can be floating gate transistors, ordinary transistors, diodes, and any other device which can be configured by appropriately forming and connecting semiconductors in thin film transistor technology. Thus, the illustration of FIG. 3 can be considered to be representative of a large scale, a VLSI, or even a ULSI integrated circuit.

With that in mind, the circuit is formed on a large insulating substrate 73, preferably a polyimide sheet. A first layer metallization is formed on the insulating substrate, and is patterned by lithographic and etching techniques to form control gates 74, 75 for the respective transistors 70, 71. The metallization layer is also patterned to form interconnects between certain of the elements, such as the interconnect 76 which connects the control gate of one or both of the transistors 70, 71. Typically, the pad 76 will be connected to one of the gates, such as the gate 74, and another similar pad will be positioned elsewhere on the substrate, to form a contact pad for operation of the control gate 75.

Deposited over the metallization is a first dielectric layer 77 which is common to the entire circuit and covers the entire metallization pattern. In the case of floating gate transistors, there is formed over the dielectric layer 77 a further metallization layer 78 which is patterned to form floating gates 78 for the floating gate transistors. A subsequent dielectric layer 79 is then deposited over the floating gate metal 78 (where present) or simply over the initial dielectric layer 77 (where the floating gate is not present), to form a composite dielectric layer. When the dielectric layer configuration of FIG. 1 is utilized, both of the layers 77 and 79 will be a silicon dioxide insulator, so that the floating gate 78 will be encapsulated in a very high resistivity material. Deposited over the dielectric layer 79, in the preferred embodiment, is a further dielectric layer 80, preferably silicon nitride, intended to provide an adequate interface to amorphous silicon semiconductor material to be deposited thereon. The amorphous semiconductor material is represented by regions 81, 82, which are preferably undoped amorphous silicon intended to receive a doped layer patterned to form source and drain regions with a channel therebetween. Considering first the floating gate transistor 70, source and drain regions 83, 84, formed of doped amorphous silicon material, are deposited on the amorphous silicon layer 81, defining a channel 85 therebetween. Metallization, preferably chromium, is deposited on the source and drain regions 83, 84 to form metal contacts 86, 87 for connection to the source and drain of the transistor. An upper layer of metallization is deposited to form an electrical connection with the metal contacts 86, 87, and to ultimately form contact pads 88, 89 for the source and drain. An insulating layer of material such as silicon dioxide is represented at 90. It is seen that the insulating layer 90 completely surrounds the amorphous silicon transistor layer 81, and thus serves as a barrier between the device 70 and any closely adjacent devices. The formation of a trench layer filled with insulating material 90 around the individual devices will be described in greater detail below. For the moment, suffice is to say that the trench, which is formed by removal of the amorphous silicon semiconductor material, is a significant feature in preventing leakage, cross talk or interference from one device to another.

Turning to the non-memory transistor device 71, it will be seen that formed over the amorphous silicon region 82, are a pair of doped regions 91, 92 serving as the source and drain with chromium metallization layers 93, 94 deposited thereon, and contacts 95, 96 in electrical contact with the chromium layers 93, 94. The same insulating material 90 which surrounds the device 70, also surrounds the device 71. The trenches which are formed around the device 70 are formed at the same time as the trenches which surround the device 71, and all other devices on the substrate which are intended to be trenched.

For purposes of illustrating a control gate and its connections to the outside world, the metallization area 76, which in the present example is said to represent the contact for the control gate 74, is made accessible to the surface of the semiconductor device by way of a via 97 etched through the device and reaching the chromium contact region 76. Metallization 98 is deposited in the via 97 and forms a pad 99 over the surface of the insulating layer 90 to allow electrical contact to the control gate of the floating gate transistor 70.

Those skilled in the art will appreciate that a device similar to that shown in FIG. 3 can be configured with the single component dielectric layer of FIG. 2. In that case, a first portion of the dielectric layer is deposited, followed by deposition and patterning of the floating gate, followed by the continued deposition of the same type of dielectric material to complete the dielectric layer. As noted above, the single dielectric layer is perferably of aluminum nitride.

Figure 5A:
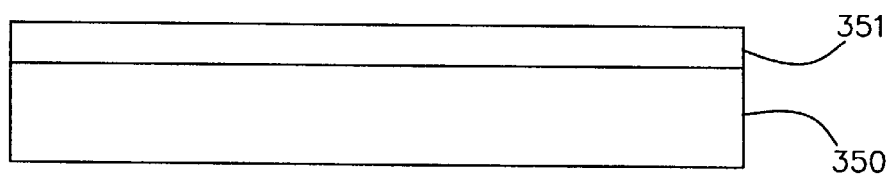
FIGS. 5A–5L illustrate formation of a floating gate thin film transistor device at various stages of fabrication.

A currently preferred process for fabrication of devices according to the present invention is illustrated in connection with the flow chart of FIG. 4 and with the schematic cross-sectional flow diagrams of FIGS. 5A–5L. FIGS. 4 and 5 relate to the same process except at the very beginning. In the beginning of FIG. 4, the process is commenced on a dielectric film, such as a sheet of film. By way of contrast, the FIG. 5 flow starts with FIG. 5A showing a silicon wafer 350 on which a polyimide or epoxy film 351 is spun on and baked to form a thin, smooth insulating film 351 over the silicon wafer 350. The film is deposited in a way which allows the polyimide film to be stripped from the silicon wafer at the end of processing to provide an amorphous silicon thin film transistor device on a thin flexible insulating sheet. In the process, the silicon wafer is used simply as a rigid support for the device which is readily accommodated in conventional semiconductor process equipment.

Figure 5B:
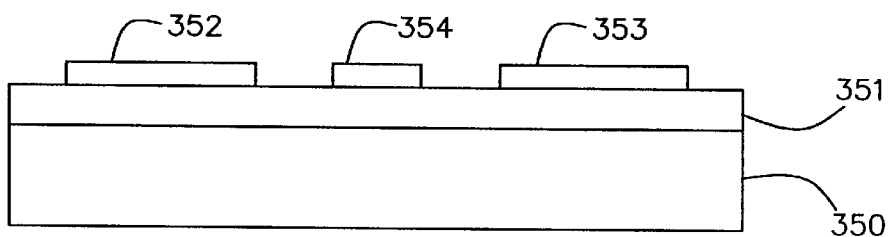
Figure 5C:
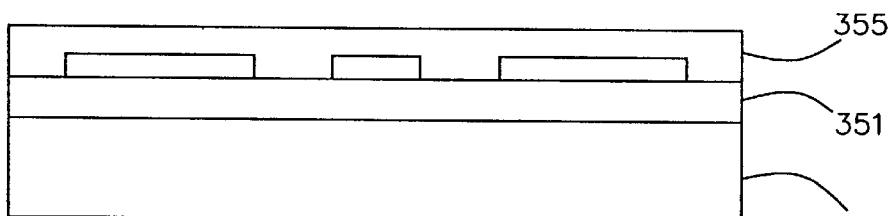

FIG. 5B illustrates the deposition and formation of the lower metallization on the insulating substrate. Formation of the chromium gates and lower metallization is also illustrated in the FIG. 4 flowchart. A first step 310 is performed to metallize the polyimide or insulating substrate. Such metallization is by electron beam evaporation of chromium to produce a layer of approximately 500 angstroms. The gate metal is then patterned in a step 311. Patterning entails a first lithographic step for masking of the gate metal to expose only those areas which are to form control gates for thin film transistors and lower metallization interconnects. Following the lithographic patterning step, the unmasked metal is removed by a wet etching process to produce a device such as illustrated in FIG. 5B, having control gates 352, 353 and interconnecting metallization 354.

Figure 5D:
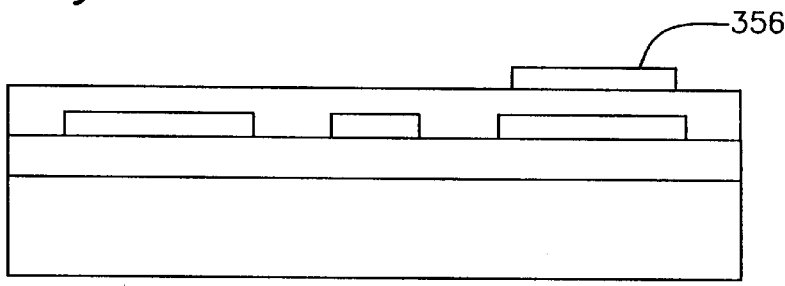
Figure 5E:
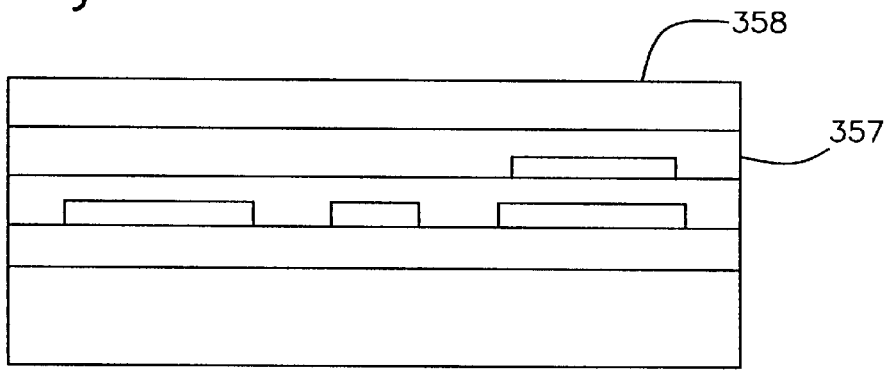

The dielectric layer is then deposited over the lower metallization layer. In the presently preferred practice of the invention, a two-layer dielectric is employed, with the first layer encapsulating the floating gate, and the second layer interposed between the first layer and the amorphous silicon for providing a defect-free interface with the amorphous silicon. In practice, the first layer is formed of two layers, preferably of the same material, as is illustrated by comparison of FIGS. 5C, 5D and 5E. As will be seen, a first oxide layer 355 is deposited which is preferably silicon dioxide. The deposition is preferably by means of plasma-enhanced chemical vapor deposition utilizing $SiH_4$ and $N_2O$ at a temperature of about 275° and at low power levels. A layer thickness of about 300 angstroms is produced, after which the floating metal gate is deposited on the partially completed dielectric layer. The floating gate 356 is preferably of aluminum formed by electron beam evaporation to a thickness of 200 to 300 angstroms. The floating gate 356 is then patterned in a second lithographic step as illustrated in FIG. 5D and as represented by the process step 313 of FIG. 4. The deposit dielectric step 312 is then completed as shown in FIG. 5E by depositing the remaining layer 357 of the oxide to encapsulate the floating gate, followed by an upper interface dielectric layer 358 adapted for interface with the amorphous silicon.

The interface dielectric is preferably silicon nitride, $Si_xN_y$, also deposited by plasma-enhanced chemical vapor deposition, without breaking vacuum from the deposition of the oxide layer 357. The chemistry utilizes $SiH_4$ and $NH_3$, and the deposition temperature is held at about 275° C. The nitride film is deposited to a thickness of about 400 angstroms.

Figure 5F:
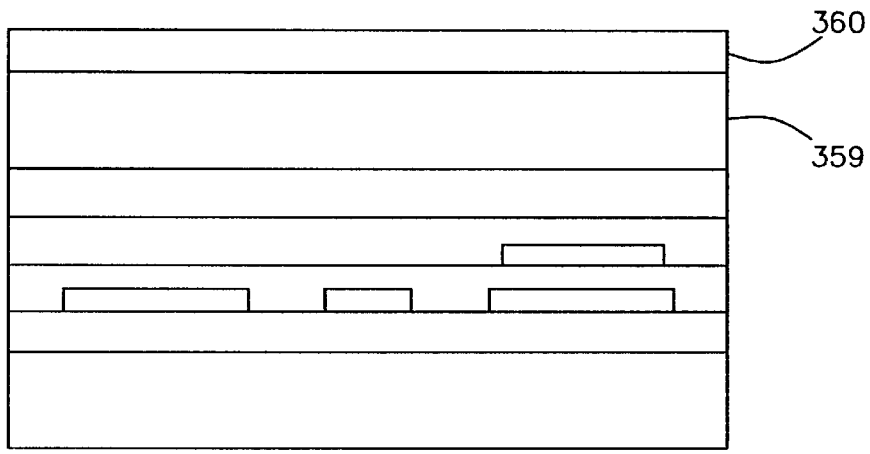
Figure 5G:
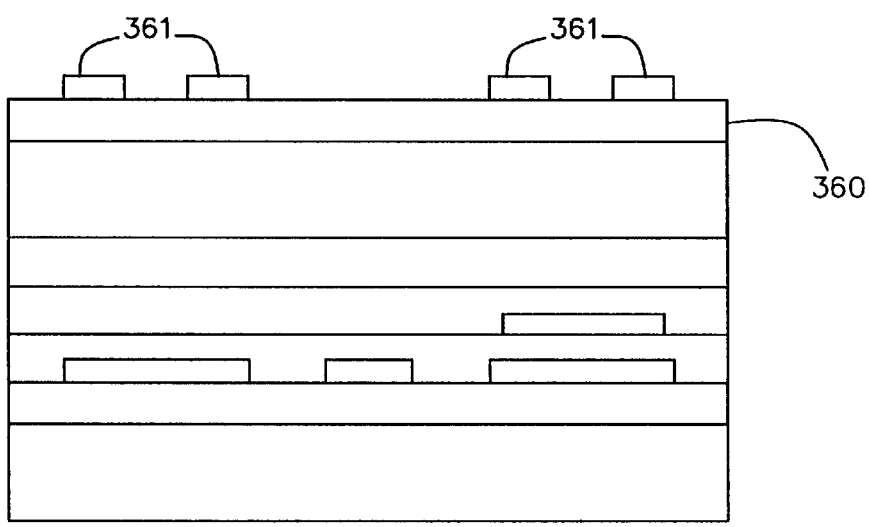
Figure 5H:
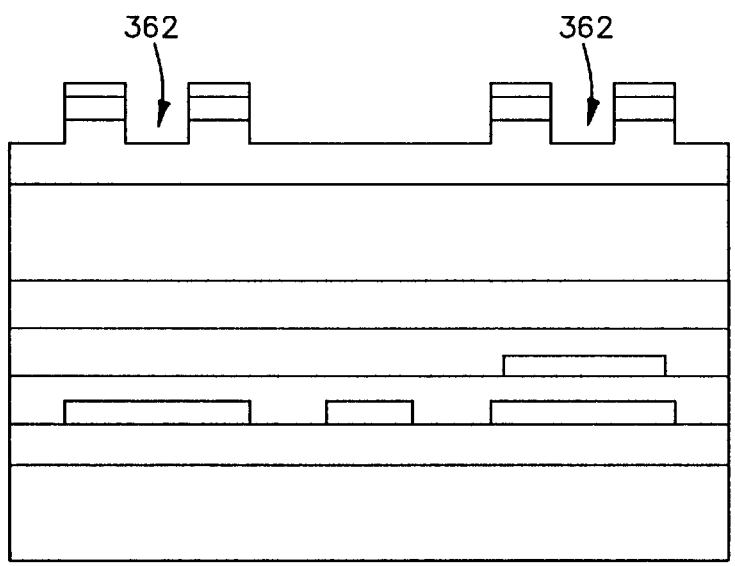

Following deposition of the dielectric layer, the active amorphous silicon layer is then deposited directly on the dielectric. As shown in FIG. 5F, undoped layer 359 of α-Si:H (approximately 1200 angstroms), is deposited from the decomposition of $SiH_4$ (10%) in $H_2$ at a pressure of about 300 mT and a temperature of about 275° C. (step 314 of FIG. 4). A dopant is then added to the atmosphere to produce a doped layer 360 also of amorphous silicon (step 315 of FIG. 10). The doping is accomplished by adding $PH_3$ (at about a 10% concentration) to the materials which had been used to form the layer 359 for the final few minutes of growth. The other deposition conditions remain the same. After completion of the deposition of the amorphous silicon layer 360, which will form the source and drain regions of the field effect transistors, chromium caps are formed on the surface of the layer 360. The caps are formed in a step 316 (FIG. 4). First of all, a thin chromium layer of about 1000 angstroms is deposited on the doped amorphous silicon as by electron beam evaporation. The metal layer is then masked and lithographically patterned (in a third lithographic step) followed by a wet etch which produces the chromium caps 361 shown in FIG. 5G. The chromium caps are then used (step 317, FIG. 4) to define the channel between the source and drain regions. The chromium caps are used as a mask for a reactive ion etch using the chemistry $CHF_3+O_2$. Etching continues until approximately 30% of the total thickness of the silicon layer is removed, thus assuring that the channel etches completely through the doped material and somewhat into the undoped layer. The region between the source and drain regions is the channel of the thin film transistor. Utilizing 2 micron technology, where 2 microns is the minimum feature size, that minimum feature size is usually the distance between the source and drain regions which forms the channel. In FIG. 5H, the channel region is denoted by the reference numeral 362.

Figure 5I:
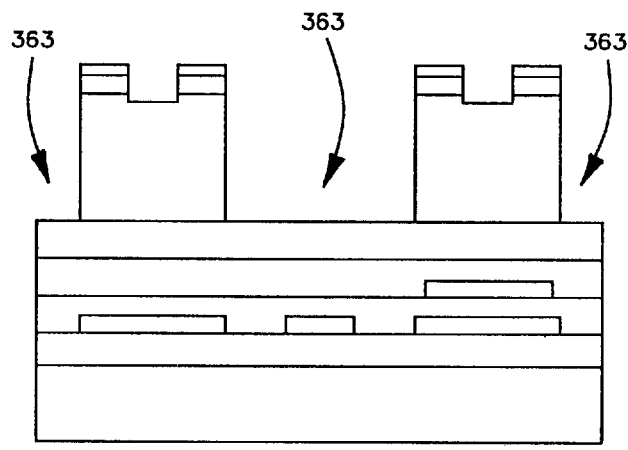

The partly completed device is then processed to produce trenches 363 around the individual devices such that leakage between devices will not be a problem even with devices very closely spaced. In addition, the isolation provided by the trenching prevents noise from propagating through the circuit. FIG. 5I shows the formation of a surround 363 by removal of the amorphous silicon between devices (completely surrounding the devices), the etch being continued until the underlying dielectric layer 358 is reached. The surround mask represents the fourth lithographic step and is illustrated at 318 in FIG. 4. The etching is preferably a reactive ion etch with the chemistry $CHF_3$ and $O_2$. It is necessary in this case to use a timed etch, but since there is a relatively thick dielectric layer below the amorphous silicon, the timing can be handled without great criticality. It is also noted that closely associated pairs or groups of transistors may, in the appropriate case be trenched as a unit, for isolation from other devices but not from other members of the group.

Figure 5J:
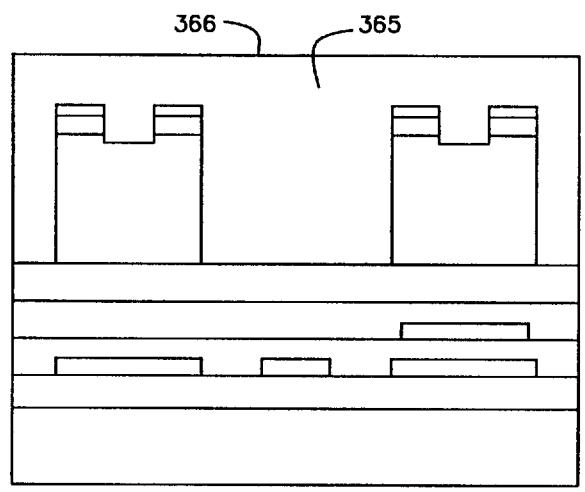
Figure 5K:
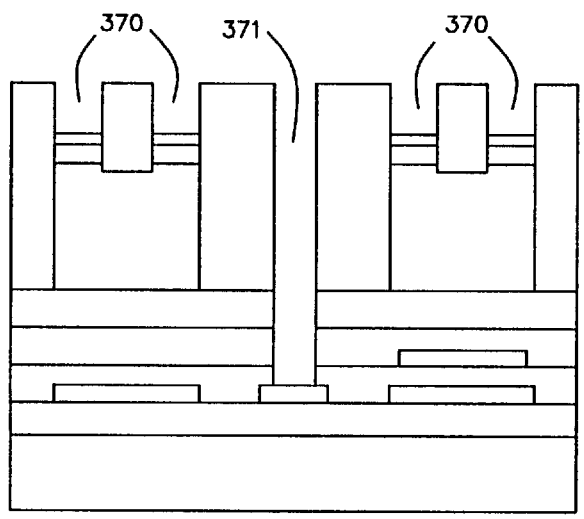

Following the isolation of the respective devices as illustrated in FIG. 5I, an oxide inter-level dielectric 365 is then deposited over the entire device as shown in FIG. 5J, and at step 319 in FIG. 4. The oxide dielectric layer 365 provides a relatively smooth planar surface 366 for further processing of the device. The next step in processing will of course be to form interconnections to the partly completed semiconductor devices which are now encapsulated in the oxide inter-level dielectric 365. That is accomplished as shown in FIG. 5K by forming vias which reach to the metallization at which electrical connections are to be made. The opening of via step in FIG. 4 is illustrated at 320. In order to form the vias, a fifth lithography step is utilized to pattern openings over the areas where contacts are to be made, that is, over the chromium contacts at the source and drain of the transistors and any gate contacts in the lower metallization layer. Following the deposition and processing of the mask (the fifth lithography step), a reactive ion etch removes the inter-level dielectric as well as the gate dielectric where present, using the chromium contacts as etch stops. Thus, it will be seen that relatively short vias 370 are formed at the source and drain of the transistors whereas a relatively longer via 371 is formed down to the lower metallization layer for connection to one of the gate contacts. The chemistry of the etch is $CHF_3$ and $O_2$, and the chromium contacts adequately act as an etch stop, such that the etch need not be timed, and it can continue through the respective depths until completed.

Figure 5L:
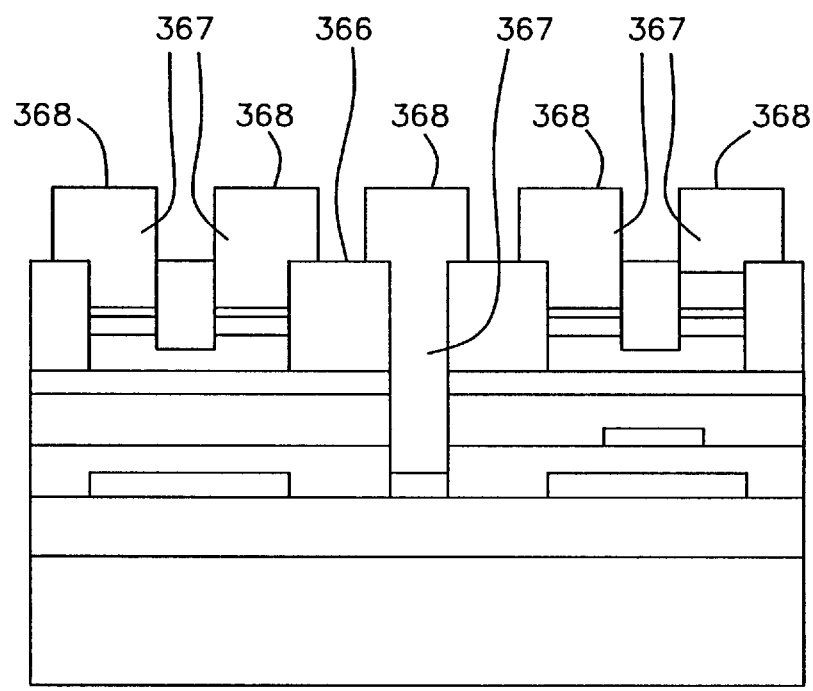

After formation of the vias, metallization and contacts for the top metal are formed. Preferably, conventional sputtering techniques are used to deposit aluminum with a slight (1%) concentration of silicon to a thickness of about 2500 angstroms. The aluminum fills the vias at 367 and also covers the surface 366 of the inter-level dielectric. After the aluminum is deposited, it is patterned and etched to provide contacts and other top metal interconnections 368. FIG. 5L illustrates the device with the top metal contacts thus formed. It will be seen that the vias are in electrical contact with the chromium caps but otherwise insulated either by the oxide level dielectric 365 or the intermediate dielectric layers 356–358. The amorphous silicon has been removed by virtue of the inter-level dielectric, and electrical contact between the metal in the vias and the amorphous silicon is thereby avoided. The patterning of the dielectric metal requires a sixth lithographic step and is represented in FIG. 4 by the steps 321, 322.

Normally, a passivation layer is deposited over the metal interconnects, and the passivation layer is patterned and etched in order to expose only the contact areas of the circuit which are to be available for later connection. That final step in the process is illustrated at 323 of FIG. 4. The patterning of the passivation layer is a seventh lithographic step associated with the process. The polyimide with a firmly attached semiconductor device is then stripped from the silicon wafer to form a thin film transistor device on insulating flexible polyimide substrate as illustrated earlier in FIG. 3 of the drawings.

Particular note was made of the lithographic steps in the foregoing process description, because their number is rather severely and intentionally limited considering the complexity of the process. Furthermore, the temperature conditions used in the process are limited to approximately 350° C. maximum, usually below 300° C. maximum, such that they are entirely compatible with the polyimide substrate, and with formation of multi-layer structures.

In fabrication of the FIG. 2 embodiment of the present invention, the process flow will be the same as that described above, with the exception of the deposition of the dielectric layer itself. In the case where the dielectric layer is to be a single component aluminum nitride layer, that layer is deposited by DC reactive sputtering, which is substantially the same process used to deposit the top metal interconnect. The conditions are changed during the sputtering operation in order to tailor the characteristics of the aluminum nitride layer to the varying requirements of the dielectric layer. For example, in the region in which the floating gate is embedded, the high resistivity requirement is satisfied by a random orientation of the crystallites in the sputtered aluminum nitride film. When aluminum nitride is highly oriented, the resistivity of the oriented layer is lower than it would be if the orientation were random. Contrary-wise, in the region adjacent the amorphous silicon layer, it is desired to have as high a dielectric constant as practical, and that requirement is met by a highly oriented film with the c-axis oriented vertically with respect to the substrate.

Those varying requirements are met in depositing the aluminum nitride film in a reactive sputtering apparatus. The apparatus has positioned therein an aluminum target which is maintained at a potential of about minus 400 volts DC. The chamber is sealed and provided with a nitrogen atmosphere. Nitrogen ions bombard the target and free aluminum ions which combine with the nitrogen to form an aluminum nitride film on the surface of the substrate. A bias ring is positioned around the substrate to control film orientation. During the first portion of the deposition, when the portion of the layer directly in contact with the lower metallization is deposited, the bias ring has no potential applied, and that produces a random orientation of the deposited film. As in the earlier embodiment, after a thin layer, such as 300 anstroms of dielectric is deposited, the floating gate metal is deposited and patterned to form the floating gates. The reactive sputtering is then continued to deposit an additional layer of dielectric over the floating gate to encapsulate it.

The conditions are the same as those utilized to form the first layer. Finally, for the top portion of the dielectric which will be in contact with the amorphous silicon, and preferably for about the top 400 angstroms, a bias of about positive 60 volts DC is applied to the bias ring around the substrate. The other conditions remain the same. Under those conditions, the aluminum nitride film which is deposited is highly oriented with the c-axis vertical with respect to the substrate. That provides the highest dielectric constant for the film in the region in contact with the amorphous silicon layer.

Following completion of the deposition of the dielectric layer as described here, the process continues as has been described with the previous embodiment.

It was also noted above that in some conditions it would be useful to deposit a thin aluminum nitride layer over a silicon dioxide lower layer encapsulating the floating gate. It will now be apparent that after the silicon dioxide dielectric and floating gate are formed, the final interface layer of aluminum nitride is formed by reactive sputtering with about a 60 volt bias on the bias ring to produce a highly oriented aluminum nitride film with c-axis vertical.

It will now be appreciated that what has been provided is an improved floating gate thin film transistor structure in which a high quality dielectric meets both the resistivity requirements for long memory retention times and the low defect density requirements for high mobility in the channel region. Preferably, the dielectric is a two-component system using a high resistivity material such as silicon dioxide (or alternatively aluminum nitride) capped by a layer of silicon nitride which forms a low defect density interface with the amorphous silicon. In an alternative configuration, with properly pure and oriented aluminum nitride, a single component dielectric is provided formed entirely of aluminum nitride. In both cases, the resistivity is adequately high, on the order of $10^{17}$ ohm-cm or better, to provide memory retention times of months or longer. The chemical structure of the interface layer in contact with the amorphous silicon is such that there is a very low density of interfacial defects which might trap charge and adversely affect the mobility characteristics of the transistor. With the provision of high quality floating gate memory transistors, production of practical memory devices at reasonable cost is enhanced.

What is claimed is:

1. A thin film floating gate transistor capable of storing electrical signals for an extended period and for use as an EEPROM, in combination:

an insulating substrate;

control gate metallization carried by the substrate and forming a control gate;

a dielectric layer over the control gate;

an amorphous silicon layer deposited on the dielectric layer, doped amorphous thin film source and drain regions on the amorphous silicon layer forming a channel between the source and drain of not more than approximately 5 microns in width;

a floating gate encapsulated in the dielectric layer;

the dielectric layer having the following two structural characteristics: (a) a high resistivity characteristic in the region encapsulating the floating gate, and (b) a low interfacial defect density in the region of the dielectric layer in contact with the amorphous silicon layer;

the structural characteristic of the dielectric providing a high resistivity for long storage times of charge on the floating gate, but low defect density in the interface with the amorphous silicon to enhance switching speed; and wherein the dielectric layer is formed of a single material comprising aluminum nitride which both encapsulates the floating gate and provides a low interfacial defect density at the interface with the amorphous silicon layer; and wherein the region of the aluminum nitride layer which encapsulates the floating gate is deposited with a random orientation to enhance resistivity, and the region of the aluminum nitride layer which is in contact with the amorphous silicon is deposited with a c-axis vertical orientation with respect to the substrate to enhance dielectric constant.

2. A thin film transistor structure comprising a plurality of thin film transistors formed on an insulating substrate, some of said transistors being of the floating gate type, and all of said transistors being formed to share a plurality of layers sequentially deposited on the insulating substrate, the thin film transistor structure comprising:

a metallization layer carried on the substrate and serving as a gate metal for the thin film transistors;

a dielectric layer deposited on the metallization layer;

an amorphous silicon layer deposited on the dielectric layer, doped amorphous silicon drain and source regions formed on the amorphous silicon layer and separated by no more than about 5 microns to form a narrow channel between the source and drain;

the floating gate thin film transistors having a floating gate formed in the dielectric layer; and the dielectric layer of all the transistors satisfying two structural requirements: (1) a high resistivity in the region encapsulating the floating gate in the floating gate transistors, and (2) a nitride layer above the high resistivity layer and in contact with the amorphous silicon layer, the nitride layer being substantially oxide-free to minimize interfacial defect trap density in the channel thereby to increase the switching speed of the thin film transistors; and wherein the dielectric layer is formed of a single material comprising aluminum nitride which both encapsulates the floating gates and provides a low interfacial defect density at the interface with the amorphous silicon layer; and wherein the region of the aluminum nitride layer which encapsulates the floating gate is deposited with a random orientation to enhance resistivity, and the region of the aluminum nitride layer which is in contact with the amorphous silicon is deposited with a c-axis vertical orientation with respect to the substrate to enhance dielectric constant.

* * * * *